United States Patent
Xia et al.

(10) Patent No.: US 8,822,286 B2
(45) Date of Patent: Sep. 2, 2014

(54) METHOD OF FABRICATING A FLASH MEMORY COMPRISING A HIGH-K DIELECTRIC AND A METAL GATE

(71) Applicant: Broadcom Corporation, Irvine, CA (US)

(72) Inventors: Wei Xia, Irvine, CA (US); Xiangdong Chen, Irvine, CA (US); Frank Hui, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/050,748

(22) Filed: Oct. 10, 2013

(65) Prior Publication Data
US 2014/0038404 A1    Feb. 6, 2014

Related U.S. Application Data (62) Division of application No. 12/590,370, filed on Nov. 6, 2009, now Pat. No. 8,558,300.

(51) Int. Cl.
*H01L 21/336*    (2006.01)

(52) U.S. Cl.
USPC .......................................... 438/257; 438/593

(58) Field of Classification Search
CPC ..................... H01L 27/11536; H01L 27/11541
USPC ............ 438/593, 257; 257/316, 369, 410, 412
See application file for complete search history.

(56) References Cited

U.S. PATENT DOCUMENTS

| | | | |
|---|---|---|---|
| 7,138,680 B2 * | 11/2006 | Li et al. | 257/315 |
| 7,989,873 B2 * | 8/2011 | Yamazaki et al. | 257/316 |
| 8,558,300 B2 * | 10/2013 | Xia et al. | 257/316 |

* cited by examiner

*Primary Examiner* — Mark Prenty
(74) *Attorney, Agent, or Firm* — Oblon, Spivak, McClelland, Maier & Neustadt, L.L.P.

(57) ABSTRACT

According to one exemplary embodiment, a method for fabricating a flash memory cell in a semiconductor die includes forming a control gate stack overlying a floating gate stack in a memory region of a substrate, where the floating gate stack includes a floating gate overlying a portion of a dielectric one layer. The floating gate includes a portion of a metal one layer and the dielectric o one layer includes a first high-k dielectric material. The control gate stack can include a control gate including a portion of a metal two layer, where the metal one layer can include a different metal than the metal two layer.

17 Claims, 9 Drawing Sheets

METHOD OF FABRICATING A FLASH MEMORY COMPRISING A HIGH-K DIELECTRIC AND A METAL GATE

This is a divisional of application Ser. No. 12/590,370 filed Nov. 6, 2009.

BACKGROUND OF THE INVENTION

1. Field of the Invention

The present invention is generally in the field of semiconductors. More particularly, the invention is in the field of fabrication of flash memory cells in semiconductor dies.

2. Background Art

Flash memory and logic circuitry are widely utilized in electronic systems in cell phones, computers, and other electronic devices. Flash memory, which can include multiple flash memory cells, and logic circuitry, which can include multiple field effect transistors (FETs), can be fabricated on separate semiconductor dies. However, it is desirable to integrate flash memory and logic circuitry on a semiconductor die in a system-on-chip (SoC) to achieve increased performance and system reconfigurability. It is further desirable to integrate flash memory and logic circuitry in an SoC using advanced process technologies, such as 45.0 nanometer (nm) and smaller process technologies.

Flash memory cells typically include a floating gate and an overlying control gate, where the floating gate and the control gate can be conventionally fabricated by utilizing a polysilicon process. For advanced process technologies, such as, for example, a 45.0 nm process technology, FETs in logic circuitry can be fabricated by utilizing a high dielectric constant (high-k) metal gate process. However, conventionally integrating flash memory cells, which are fabricating by utilizing a polysilicon process, and logic circuitry, which is fabricated by utilizing a high-k metal gate process, in an SoC can require additional masks and process steps, which can undesirably increase manufacturing cost.

SUMMARY OF THE INVENTION

A method for fabricating a flash memory cell utilizing a high-k metal gate process and related structure are provided. Features, advantages and various embodiments of the present invention are shown in and/or described in connection with at least one of the drawings, as set forth more completely in the claims.

DETAILED DESCRIPTION OF THE INVENTION

The present invention is directed to a method for fabricating a flash memory cell utilizing a high-k metal gate process and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
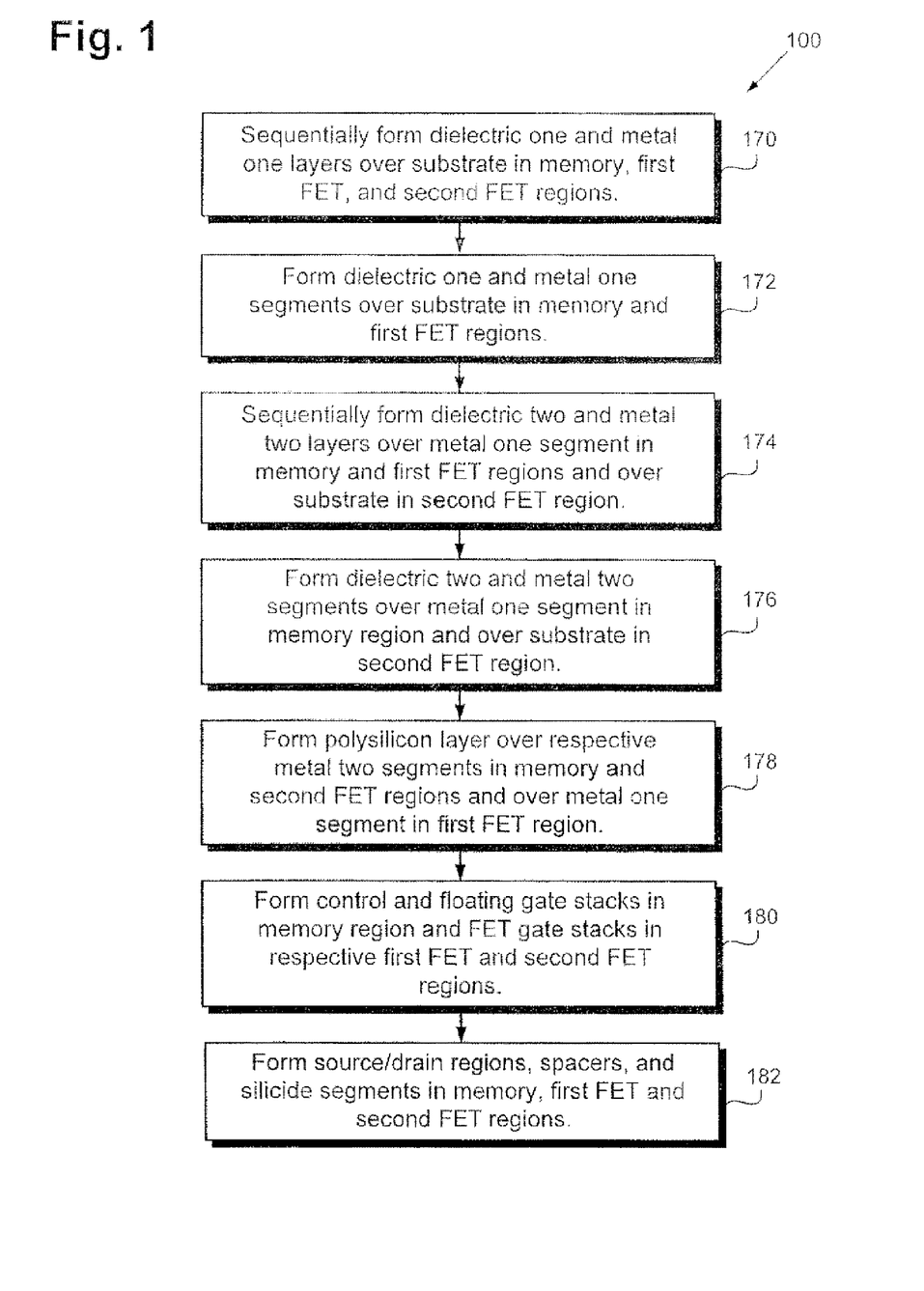
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 182 indicated in flowchart 100 are sufficient to describe one embodiment of the present invention; however, other embodiments of the invention may utilize steps different from those shown in flowchart 100. It is noted that the processing steps shown in flowchart 100 are performed on a portion of processed wafer, which, prior to step 170, includes, among other things, a substrate, such as a silicon substrate, and isolation regions, such as shallow trench isolation (STI) regions, formed in memory and field effect transistor (FET) regions of the substrate. The wafer is also referred to as a semiconductor die or simply a die in the present application.

Moreover, structures 270 through 282 in FIGS. 2A through 2G illustrate the result of performing steps 170 through 182 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
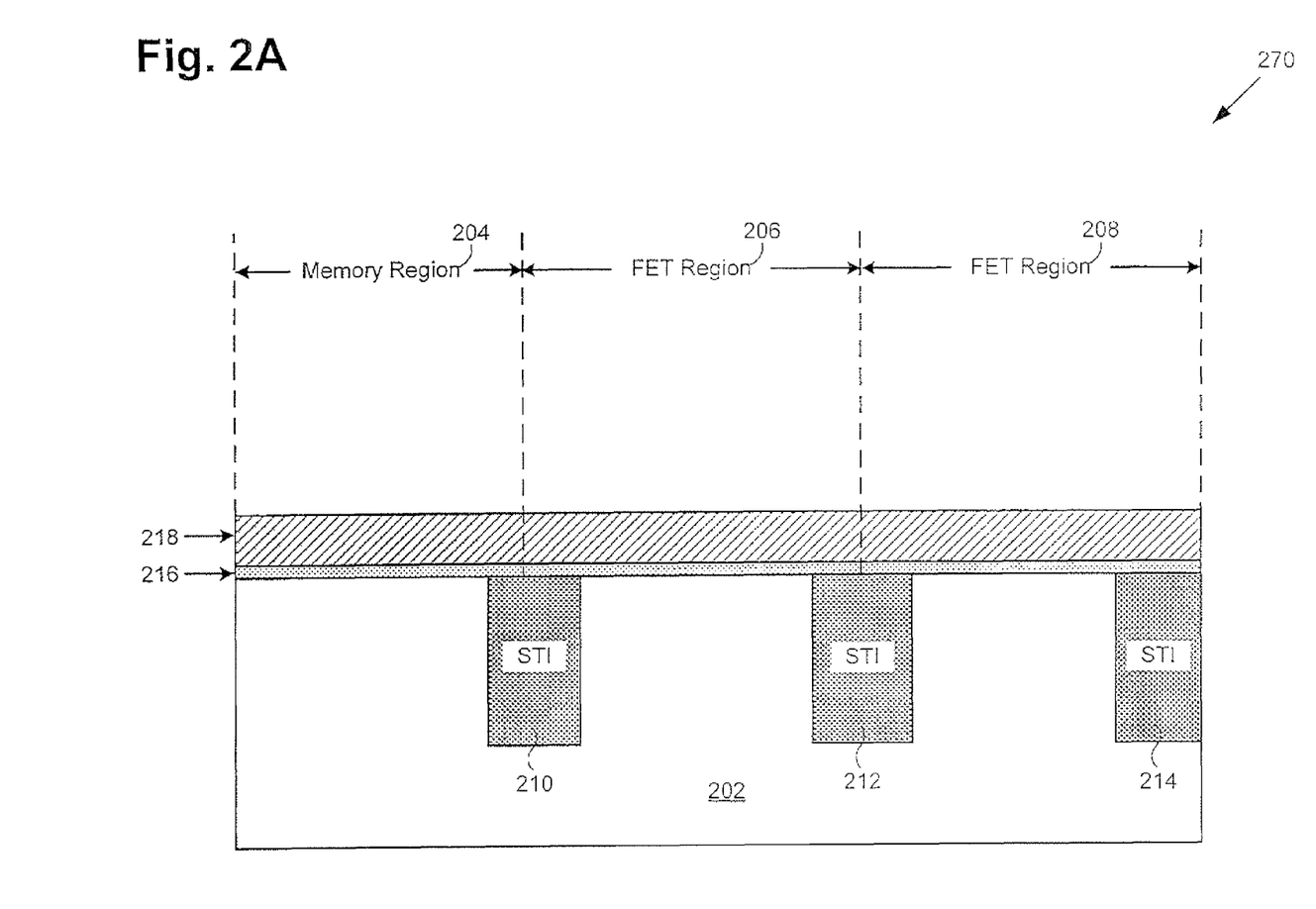
FIG. 2A illustrates a cross-sectional view, which includes a portion of a wafer processed according to an embodiment of the invention, corresponding to an initial step in the flowchart in FIG. 1.

Referring now to FIG. 2A, structure 270 of FIG. 2A shows a structure including a substrate, after completion of step 170 of flowchart 100 in FIG. 1. In structure 270, substrate 202, which can be a silicon substrate, includes memory region 204, FET region 206, and FET region 208. Memory region 204 is designated for memory cell formation and FET regions 206 and 208 are designated for FET (e.g. MOSFET) formation. FET regions 206 and 208 are designated for formation of FETs having opposite conductivity types. In embodiment of the invention, FET region 206 can be designated for formation of N channel FETs (NFETs) and FET region 208 can be designated for formation of P channel FETs (PFETs). In another embodiment, FET region 206 can be designated for formation of PFETs and FET region 208 can be designated for formation of NFETs. In structure 270, isolation regions 210, 212, and 214, which can be, for example, STI regions, are formed in substrate 202. Isolation regions 210, 212, and 214 can comprise silicon oxide or other dielectric material and can be formed in a manner known in the art.

Referring now to step 170 in FIG. 1 and structure 270 in FIG. 2A, at step 170 of flowchart 100, dielectric one layer 216 is formed over substrate 202 in memory region 204, FET region 206, and FET region 208 and metal one layer 218 is formed over dielectric one layer 216. As shown in FIG. 2A, dielectric one layer 216 is situated over isolation regions 210, 212, and 214 and substrate 202. Dielectric one layer 216 can comprise, for example, a high-k dielectric material, such as hafnium oxide ($HfO_2$), zirconium oxide ($ZrO_2$), chromium oxide ($CrO_2$), or the like. Dielectric one layer 216 can be formed, for example, by depositing a high-k dielectric material, such as hafnium oxide or zirconium oxide, over substrate 202 by utilizing a physical vapor deposition (PVD) process, a chemical vapor deposition (CVD) process, or other deposition process.

Also shown in FIG. 2A, metal one layer 218 can comprise a metal that is utilized in a FET gate, such as an NFET gate. In an embodiment of the invention, metal one layer 218 can comprise tantalum (Ta), tantalum nitride (TaN), titanium nitride (TiN), or other metal or metal stack. As shown, metal one layer 218 is situated over dielectric one layer 216 in memory region 204, FET region 206, and FET region 208. Metal one layer 218 can be formed, for example, by depositing a layer of tantalum, tantalum nitride, or titanium nitride over dielectric one layer 216 by utilizing a PVD process, a CVD process, or other deposition process. The result of step 170 of flowchart 100 is illustrated by structure 270 in FIG. 2A.

Figure 2B:
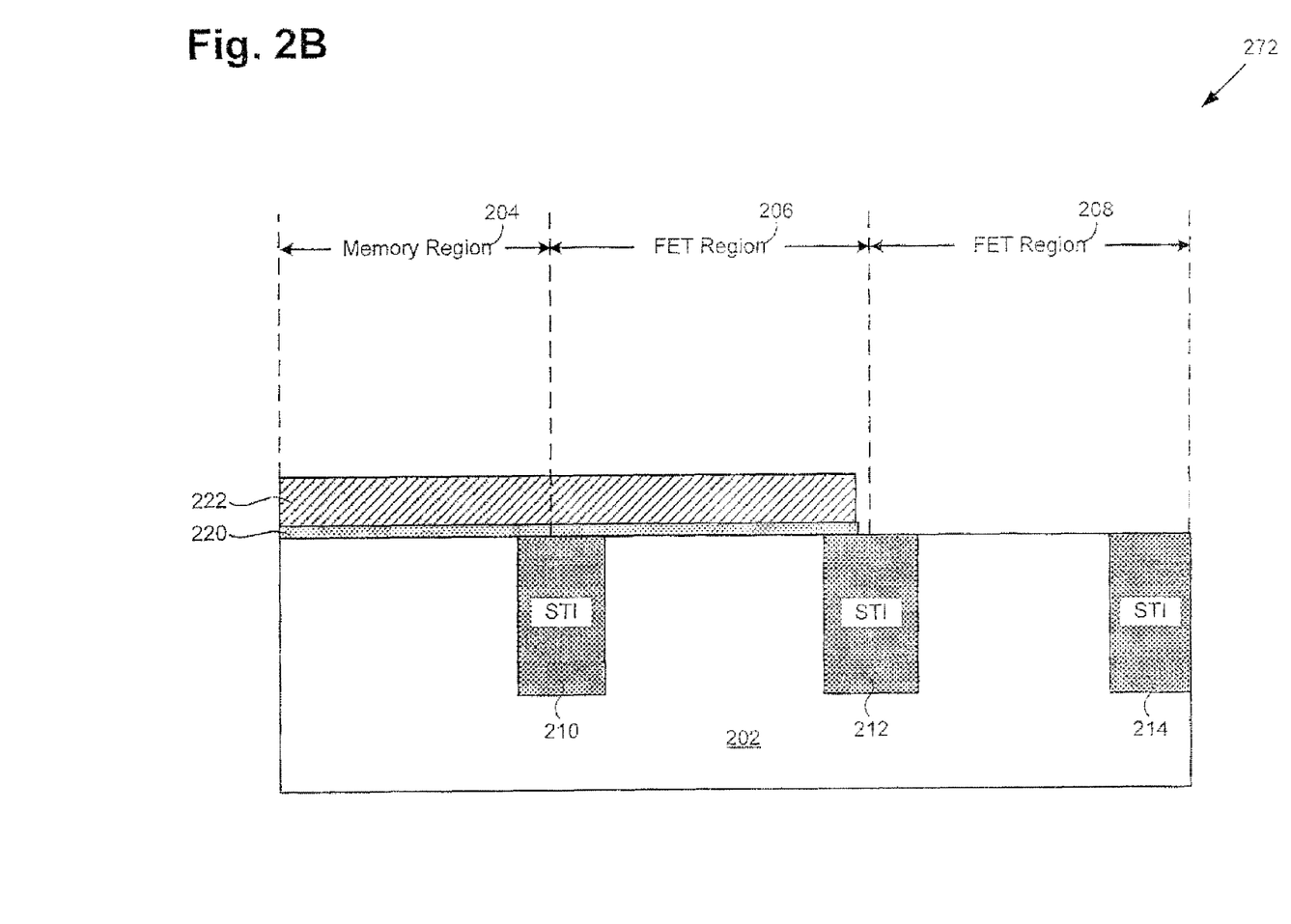
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, dielectric one segment 220 and metal one segment 222 are formed in memory region 204 and FET region 206. As shown in FIG. 2B, dielectric one segment 220 is situated over substrate 202 and over isolation regions 210 and 212 and metal one segment 222 is situated over dielectric segment 220. Dielectric one segment 220 and metal one segment 222 can be formed by, for example, appropriately patterning dielectric one layer 216 (shown in FIG. 2A) and metal one layer 218 (shown in FIG. 2A). During the patterning process, which can include a masking step and an etch step, metal one layer 218 and dielectric one layer 216 can be removed from FET region 208. The result of step 172 of flowchart 100 is illustrated by structure 272 in FIG. 2B.

Figure 2C:
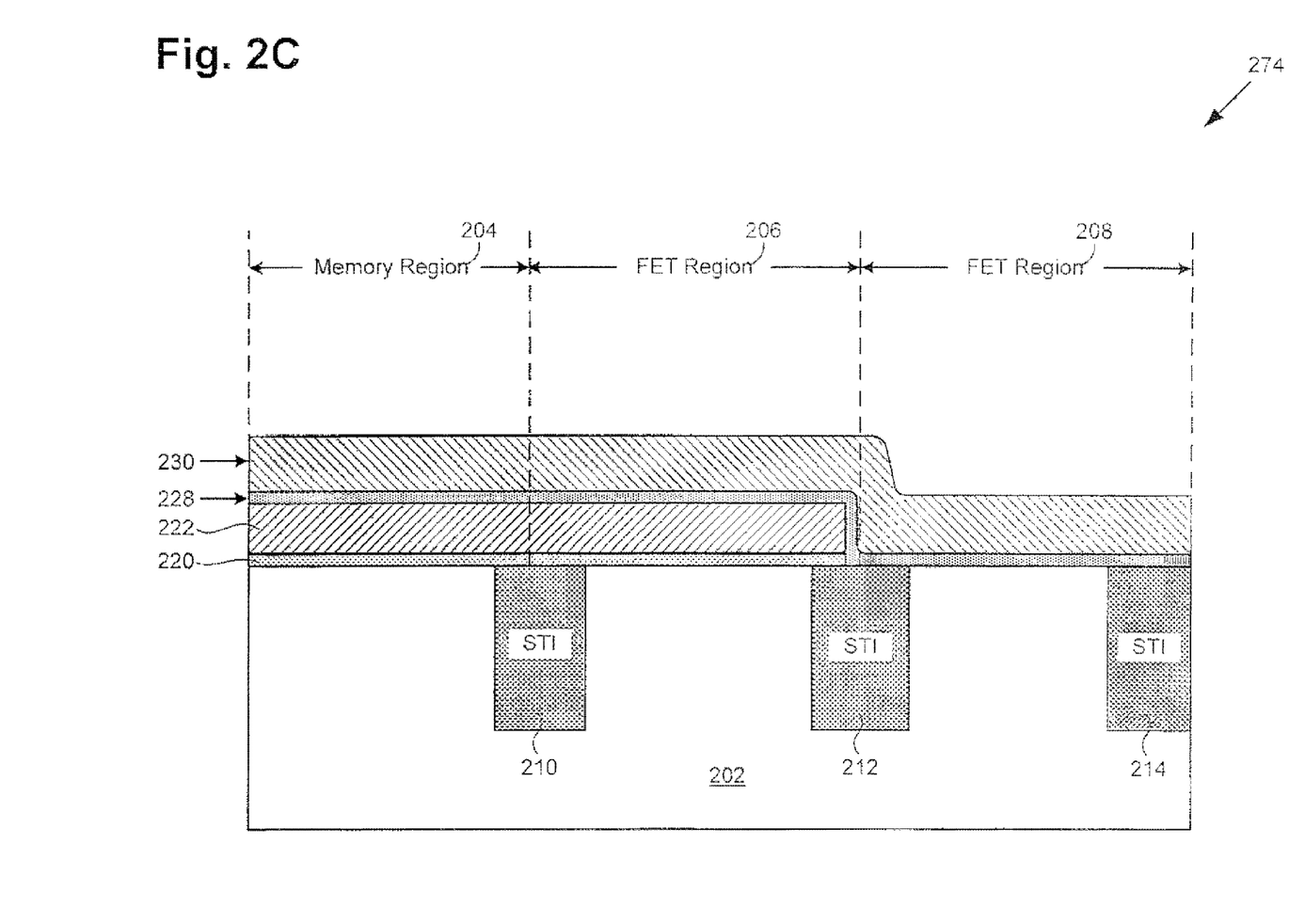
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, dielectric two layer 228 is formed over substrate 202 in FET region 208, over metal one segment 222 in memory region 204 and FET region 206, and over isolation regions 212 and 214 in substrate 202. As shown in FIG. 2C, dielectric two layer 228 is situated over isolation regions 212 and 214 and substrate 202 in FET region 208, metal one segment 222 in FET region 206, and metal one segment 222 in memory region 204. Dielectric two layer 228 can comprise, for example, a high-k dielectric material, such as hafnium oxide, zirconium oxide, chromium oxide, or the like. In one embodiment, dielectric two layer 228 can comprise the same dielectric material as dielectric one layer 216. In another embodiment, dielectric two layer 228 can comprise a different dielectric material than dielectric one layer 216. Dielectric two layer 228 can be formed, for example, by conformally depositing a high-k dielectric material, such as hafnium oxide or zirconium oxide, over substrate 202 by utilizing a PVD process, a CVD process, or other deposition process.

Also shown in FIG. 2C, metal two layer 230 can comprise a metal that is utilized in a FET gate, such as a PFET gate. In an embodiment of the invention, metal two layer 230 can comprise, for example, molybdenum (Mo), ruthenium (Ru), tantalum carbide nitride (TaCN), or other metal or metal stack. As shown, metal two layer 230 is situated over dielectric two layer 228 in memory region 204, FET region 206, and FET region 208. Metal two layer 230 can be formed, for example, by conformity depositing a layer of metal, such as molybdenum, ruthenium, or tantalum carbide nitride, over dielectric one layer 216 by utilizing a PVD process, a CVD process, or outer deposition process. Metal two layer 230 can comprise a metal having a different workfunction compared to the metal in metal one layer 218 (shown in FIG. 2A). The result of step 174 of flowchart 100 is illustrated by structure 274 in FIG. 2C.

Figure 2D:
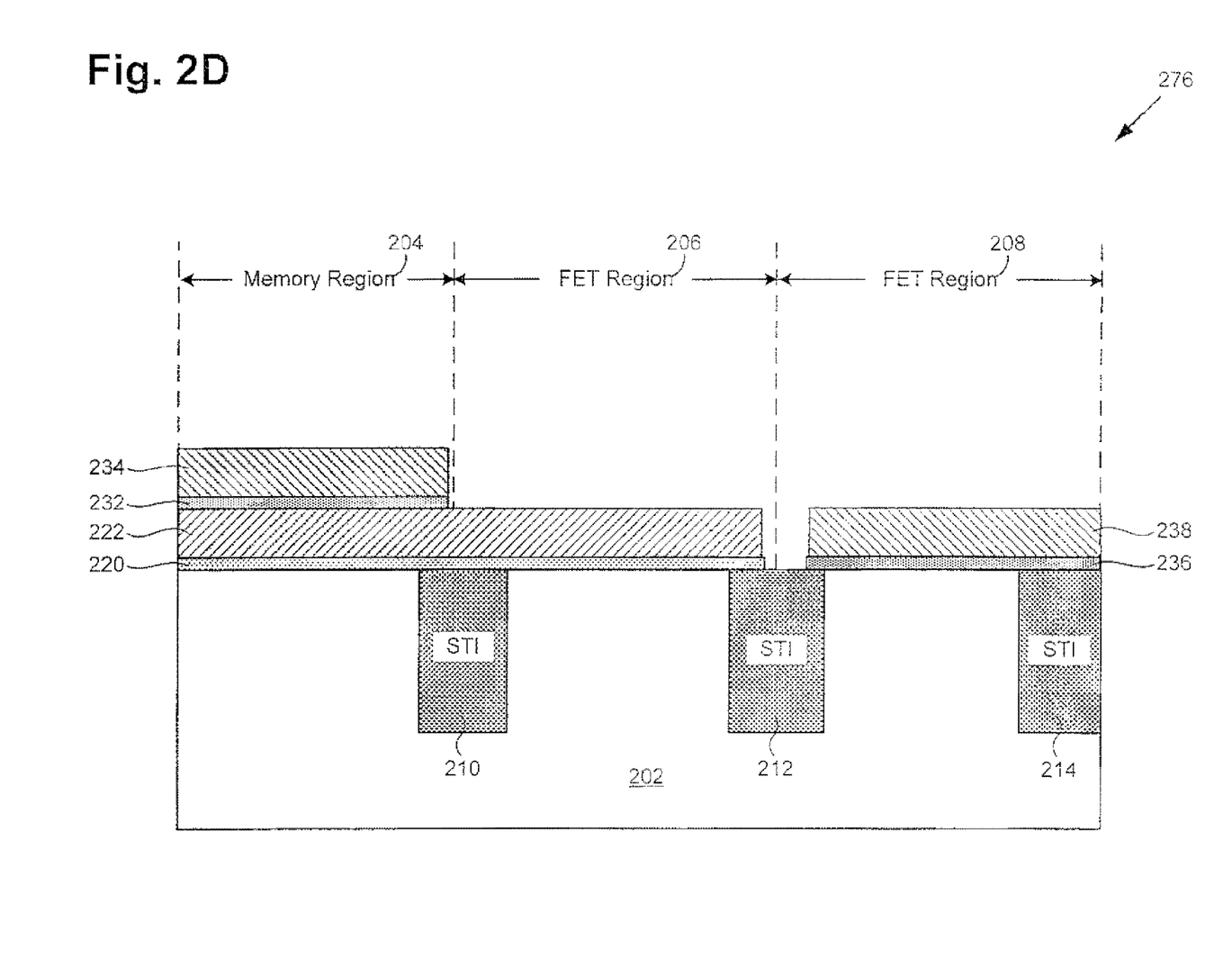
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, dielectric two segment 232 and metal two segment 234 are formed over metal one segment 222 in memory region 204 and dielectric two segment 236 and metal two segment 238 are formed over substrate 202 in FET region 208. As shown in FIG. 2D, dielectric two segment 232 is situated over metal one segment 222 and metal two segment 234 is situated over dielectric two segment 232 in memory region 204. Also shown in FIG. 2D, dielectric two segment 236 is situated over substrate 202 and isolation regions 212 and 214 and metal two segment 238 is situated over dielectric two segment 236 in FET region 208. Dielectric two segments 232 and 236 and metal two segments 234 and 238 can be formed, for example, by appropriately patterning dielectric two layer 228 (shown in FIG. 2C) and metal two layer 230 (shown in FIG. 2C).

During the patterning process, which can include a masking step and an etch step, metal two layer 230 and dielectric two layer 228 can be removed from FET region 206 in the etch step. The result of step 176 of flowchart 100 is illustrated by structure 276 in FIG. 2D.

Figure 2E:
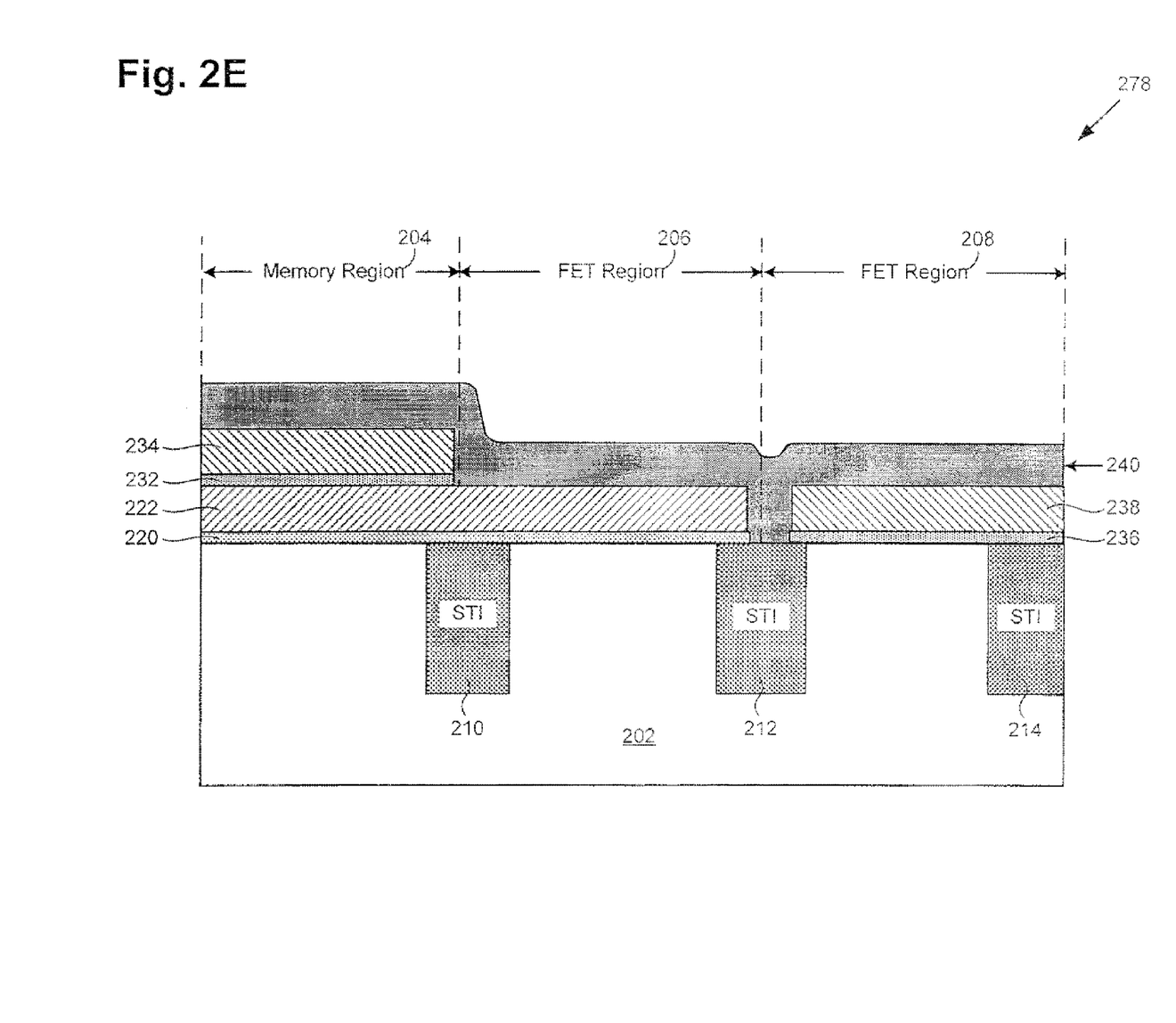
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, polysilicon layer 240 is formed over metal two segment 234 in memory region 204, over metal one segment 222 in FET region 206, and over metal two segment 238 in FET region 208. Polysilicon layer 240 is also formed over isolation region 212 in FET regions 206 and 208. As shown in FIG. 2E, polysilicon layer 240 is situated over metal two segment 234, metal one segment 222, isolation region 212, and metal two segment 238. Polysilicon layer 240 can comprise polysilicon and can be utilized for gate formation in FET regions 206 and 208 and memory region 204. Polysilicon layer 240 can be formed, for example, by conformally depositing a layer of polysilicon in memory region 204, FET region 206, and FET region 208 by utilizing a low pressure chemical vapor deposition (LPCVD) process or other suitable deposition process. The result of step 178 of flowchart 100 is illustrated by structure 278 in FIG. 2E.

Figure 2F:
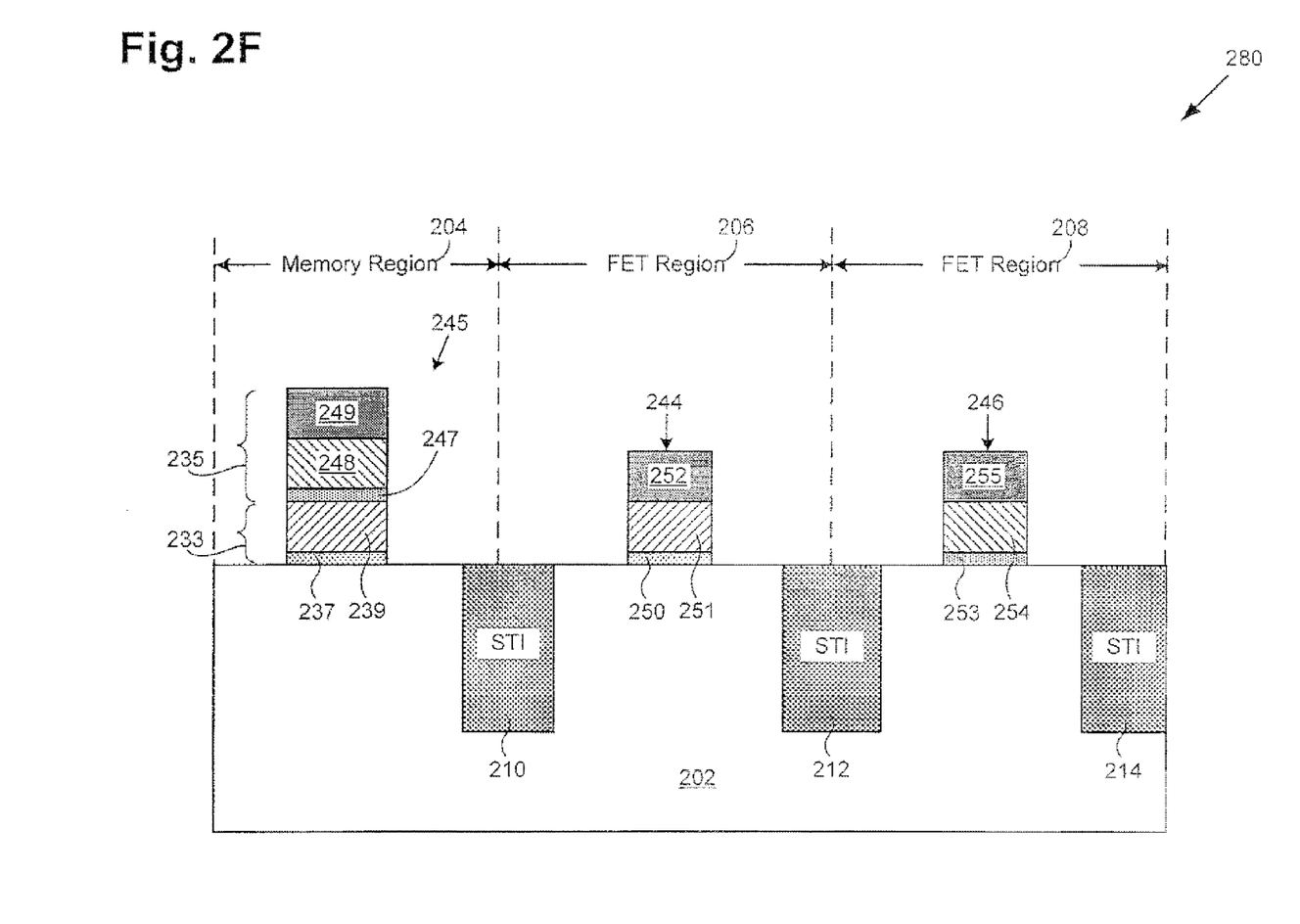
FIG. 2F illustrates a cross-sectional view, which includes a portion of a wafer processed according to an embodiment of the invention, corresponding to an intermediate step in the flowchart in FIG. 1.

Referring to step 180 in FIG. 1 and structure 280 in FIG. 2F, at step 180 of flowchart 100, FET gate stack 244 is formed in FET region 206, FET gate stack 246 is formed in FET region 208, and control gate stack 235 and floating gate stack 233 are formed in memory region 204. As shown in FIG. 2F, floating gate stack 233 includes dielectric one portion 237, which is a portion of dielectric one segment 220 (shown in FIG. 2E), and metal one portion 239, which is a portion of metal one segment 222 (shown in FIG. 2E). Dielectric one portion 237 and metal one portion 239 are formed from dielectric one layer 216 (shown in FIG. 2A) and metal one layer 218 (shown in FIG. 2A), respectively. Therefore, dielectric one portion 237 is also a portion of dielectric one layer 216 and metal one portion 239 is also a portion of a metal one layer 218.

Further shown in FIG. 2F, control gate stack 235 includes dielectric two portion 247, which is a portion of dielectric two segment 232 (shown in FIG. 2E), metal two portion 248, which is a portion of metal two segment 234 (shown in FIG. 2E), and polysilicon segment 249. Dielectric two portion 247 and metal two portion 248 are formed from dielectric two layer 228 (shown in FIG. 2C) and metal two layer 230 (shown in FIG. 2C), respectively.

Therefore, dielectric two portion 247 is also a portion of dielectric two layer 228 and metal two portion 248 is also a portion of metal two layer 230.

Further shown in FIG. 2F, in memory region 204, floating gate stack 233 is situated over substrate 202 and control gate stack 235 is situated over floating gate stack 233. As shown in FIG. 2F, in floating gate stack 233, metal one portion 239 is situated over dielectric portion 237. Also shown in FIG. 2F, in control gate stack 235, metal two portion 248 is situated over dielectric two portion 247 and polysilicon segment 249 is situated over metal two portion 248. Further shown in FIG. 2F, metal one portion 239 forms a floating gate of flash memory cell 245 and metal two portion 248 and polysilicon segment 249 form a control gate of flash memory cell 245.

In an embodiment of the invention, dielectric one portion 237 and dielectric two portion 247 can each have a thickness of, for example, between approximately 5.0 Angstroms and approximately 30.0 Angstroms. In an embodiment, metal one portion 239 and metal two portion 248 can each have a thickness of, for example, between approximately 50.0 Angstroms and approximately 200.0 Angstroms. Polysilicon segment 249 can have a thickness of, for example, between approximately 200.0 Angstroms and approximate 500.0 Angstroms, in an embodiment of the invention.

Also shown in FIG. 2F, FET gate stack 244 includes dielectric one portion 250, which is situated over substrate 202, metal one portion 251, which is situated over dielectric one portion 250, and polysilicon segment 252, which is situated over metal one portion 251. In FET gate stack 244, dielectric one portion 250 can form an NFET gate dielectric metal one portion 251 and polysilicon segment 252 can form an NFET gate. Further shown in FIG. 2F, FET gate stack 246 includes dielectric two portion 253, which is situated over substrate 2, metal two portion 254, which is situated over dielectric two portion 253, and polysilicon segment 255, which is situated over metal two portion 254. In FET gate stack 246, dielectric two portion 253 can form a PFET gate dielectric and metal two portion 254 and polysilicon segment 255 can form a PFET gate.

Floating gate stack 233 and control gate stack 235 can be formed by appropriately patterning polysilicon layer 240, metal two segment 234, dielectric two segment 232, metal one segment 222 and dielectric one segment 220 (shown in FIG. 2E), FET gate stack 244 can be formed by appropriately patterning polysilicon layer 240, metal one segment 222 and dielectric one segment 220 (shown in FIG. 2E), and FET gate stack 246 can he formed by appropriately patterning polysilicon layer 240, metal two segment 238 and dielectric two segment 236 (shown in FIG. 2E). The patterning process utilized to form gate stacks 233 and 235, FET gate stack 244, and FET gate stack 246 can include a masking step and an etching step. The result of step 180 of flowchart 100 is illustrated by structure 280 in FIG. 2F.

Figure 2G:
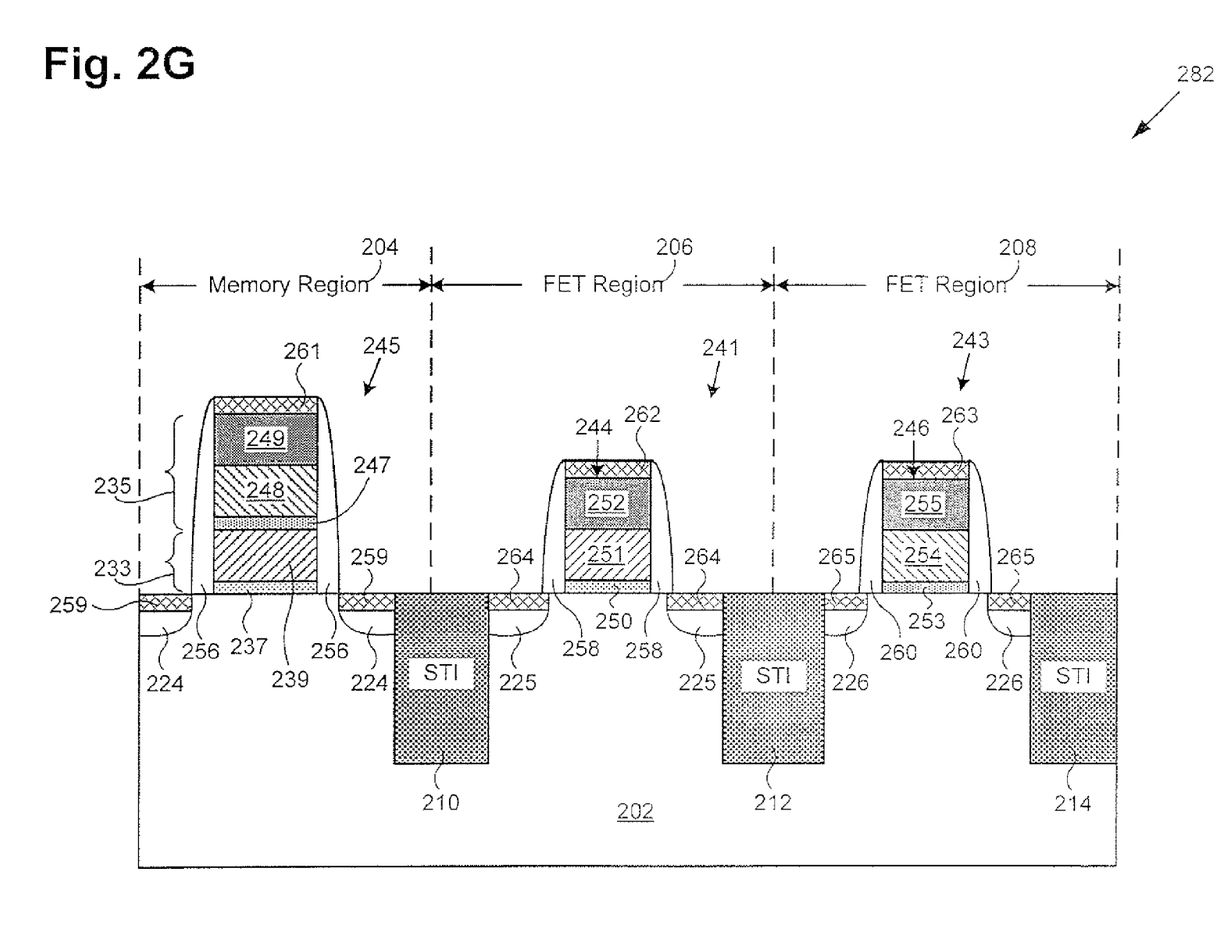
FIG. 2G illustrates a cross-sectional view, which includes a portion of a wafer processed according to an embodiment of the invention, corresponding to a final step in the flowchart in FIG. 1.

Referring to step 182 in FIG. 1 and structure 282 in FIG. 2G, at step 182 of flowchart 100, spacers 256, and silicide segments 259 and 261 are formed in memory region 204, spacers 258 and silicide segments 262 and 264 are formed in FET region 206, and spacers 260 and silicide segments 263 and 265 are formed in FET region 208. Also at step 182 of flowchart 100, source/drain regions 224, 225, and 226 are formed in substrate 202 adjacent to respective floating and control gate stacks 233 and 235 in memory region 204, FET gate stack 244 in FET region 206, and FET gate stack 246 in FET region 208.

As shown in FIG. 2G, spacers 256 are situated adjacent to respective sides of floating gate and control gate stacks 233 and 235, spacers 258 are situated adjacent to respective sides of FET gate stack 244, and spacers 260 are situated adjacent to respective sides of FET gate stack 246. Spacers 256, 258, and 260 can comprise silicon oxide or other dielectric material as is known in the art. Spacers 256, 258, and 260 can be formed, for example, by conformally depositing a layer of dielectric material, such as silicon oxide, over control gate stack 235, FET gate stack 244, and FET gate stack 246, by utilizing a CVD process or other deposition process and appropriately etching the layer of dielectric material in an etch-back process.

Also shown in FIG. 2G, silicide segment 261 is situated on polysilicon segment 249 of control gate stack 235, suicide segments 259 are situated on source/drain regions 224 adjacent to gate stacks 233, silicide segment 262 is situated on polysilicon segment 252 in FET gate stack 244, silicide segments 264 are situated on source/drain regions 225 adjacent to FET gate stack 244, silicide segment 263 is situated on polysilicon segment 255 in FET gate stack 246, and silicide segments 265 are situated on source/drain regions 226 adjacent to FET gate stack 246. Silicide segments 259, 261, 262, 263, 264, and 265 can each comprise a metal silicide, such as, for example, nickel silicide or cobalt silicide, and can be formed in a manner known in the art.

As further shown in FIG. 2G, FET 241 (e.g. a MOSFET) includes FET gate stack 244 and source/drain regions 225 and FET 243 (e.g. a MOSFET) includes FET gate stack 246 and source/drain regions 226. In the present embodiment, FET 241 can be an NFET and FET 243 can be a PFET. In another embodiment FET 241 can be a PFET and FET 243 can be an NFET. The result of step 182 of flowchart 100 is illustrated by structure 282 in FIG. 2G.

In an embodiment of the invention shown in FIGS. 2A through 2G, control gate stack 235 corresponds to FET gate stack 246. Thus, metal two portion 248 of control gate stack 235 can comprise the same gate metal as the metal gate in FET gate stack 246. Also, in the embodiment of the invention shown in FIGS. 2A through 2G, metal one portion 239 of floating gate stack 233 can comprise the same gate metal as the metal gate in FET gate stack 244. However, in another embodiment, the process for forming flash memory cell 245, FET gate stack 244, and FET gate stack 246 can be performed in a different order.

Thus, in such embodiment, the metal portion of control gate stack 235 can comprise the same metal as is utilized in FET gate stack 244 and the metal portion of floating gate 233 of flash memory cell 245 can comprise the same metal as is utilized in FET gate stack 246.

By utilizing a gate high-k dielectric material for a flash memory cell dielectric and gate metal for the control and floating gates, the process for forming an embodiment of the invention's flash memory cell 245 is compatible with a high-k metal gate process for advanced process technologies, such as 45.0 nanometer (nm) and smaller process technologies. Also, by forming a flash memory cell in a memory region of a substrate while concurrently forming an NFET gate stack in a one FET region of the substrate and a PFET gate stack in another FET region of the substrate, an embodiment of the present invention can advantageously form a flash memory cell (e.g. flash memory cell 245) without requiring any additional masks other than the masks required to form the NFET and PFET gate stacks.

Figure 3:
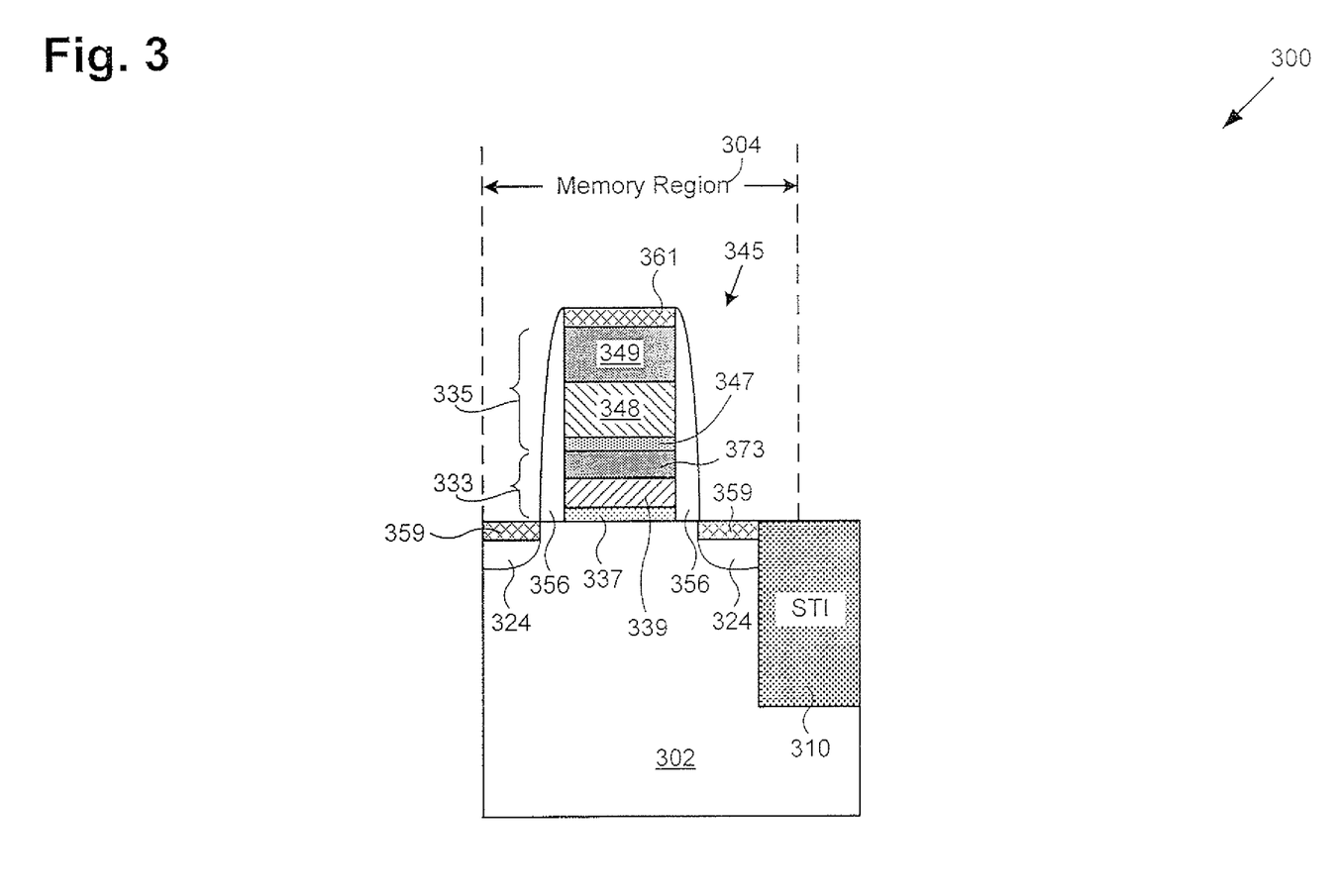
FIG. 3 illustrates a cross-sectional view of an exemplary flash memory cell in accordance with one embodiment of the present invention.

Referring now to FIG. 3, a cross-sectional view of an exemplary structure including an exemplary flash memory cell in accordance with one embodiment of the present invention is shown. In structure 300 in FIG. 3, flash memory cell 345 can be formed by utilizing a variation of the method of flowchart 100 in FIG. 1. In FIG. 3, control gate stack 335, metal one portion 339, dielectric one portion 337, metal one portion 339, dielectric two portion 347, metal two portion 348, polysilicon segment 349, silicide segments 359 and 361, spacers 356, source/drain regions 324, isolation region 310, memory region 304, and substrate 302 correspond, respectively, to control gate stack 235, metal one portion 239, dielectric one portion 237, metal one portion 239, dielectric two portion 247, metal two portion 248, polysilicon segment 249, silicide segments 259 and 261, spacers 256, source/drain regions 224, isolation region 210, memory region 204, and substrate 202 in structure 282 in FIG. 2G.

In FIG. 3, flash memory cell 345 is similar to flash memory cell 245 in FIG. 2G, with a difference being that floating gate stack 333 in flash memory cell 345 includes a polysilicon segment (i.e. polysilicon segment 373) while floating gate stack 233 in flash memory cell 245 does not include a polysilicon segment. As shown in FIG. 3, in memory region 304, flash memory cell 345 includes floating gate stack 333, control gate stack 335, spacers 356, silicide segments 359 and 361, and source/cain regions 324. Further shown in FIG. 3, floating gate stack 333 includes dielectric one portion 337, metal one portion 339, and polysilicon segment 373. Also shown in FIG. 3, control gate stack 335 includes dielectric two portion 347, metal two portion 348, and polysilicon segment 349. Thus, in contrast to flash memory cell 245 in FIG. 2G, flash memory cell 345 includes a polysilicon segment in each floating gate and control gate stack.

Also shown in FIG. 3, floating gate stack 333 is situated over substrate 302 and control gate stack 335 is situated over floating gate stack 333. Further shown in FIG. 3, metal one portion 339 is situated over dielectric one portion 337 and polysilicon segment 373 is situated over metal one portion 339. Also shown in FIG. 3, metal two portion 348 is situated over dielectric two portion 347 and polysilicon segment 349 is situated over metal two portion 348. In FIG. 3, metal one portion 339 and polysilicon segment 373 form a floating gate of flash memory cell 345 and metal two segment 348 and polysilicon segment 349 form a control gate of flash memory cell 345. As shown in FIG. 3, spacers 356 are situated adjacent to respective sides of floating gate stack 333 and also situated adjacent to respective sides of control gate stack 335. Silicide segment 361 is situated on polysilicon segment 349 of control gate stack 335 and silicide segments 359 are situated on source/drain regions 324, which are situated in substrate 302.

Flash memory cell 345 can be formed by adding a step of depositing a layer of polysilicon over metal one layer 218 (shown in FIG. 2A) at step 170 of flowchart 100 in FIG. 1. In FIG. 3, flash memory cell 345 provides similar advantages as flash memory cell 245 in FIG. 2G.

Thus, as discussed above, in the embodiments in FIGS. 1, 2A through 2G, and 3, the invention provides a flash memory cell that can be advantageously formed in a memory region of a substrate concurrently with the formation of NFET and PFET gates in respective FET regions of the substrate by utilizing a high-k metal gate process. Embodiments of the invention's flash memory cell can also be fabricated concurrently with NFET and PFET gates without requiring additional masks or process steps. By not requiring additional masks and process steps, the present invention provides a flash memory cell that can be fabricated at a significantly lower cost compared to a conventional flash memory cell that is not compatible with a high-k metal gate process.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive, it should also be understood that the invention is not limited to the particular embodiments described herein but is capable of many rearrangements, modifications, and substitutions without departing from the scope of the invention.

The invention claimed is:

1. A method of fabricating a flash memory cell in a semiconductor die, said method comprising:

forming a control gate stack overlying a floating gate stack in a memory region of a substrate, said floating gate stack including a floating gate overlying a portion of a dielectric one layer, said floating gate comprising a portion of a metal one layer, and said dielectric one layer comprising a first high-k dielectric material, wherein said control gate stack includes a control gate comprising a portion of a metal two layer, and said control gate further comprises a portion of a polysilicon layer overlying said portion of said metal two layer.

2. The method of claim 1, wherein said metal one layer comprises a different metal than said metal two layer.

3. The method of claim 1, wherein said control gate stack further includes a dielectric two layer comprising a second high-k dielectric material.

4. The method of claim 1, wherein said control gate stack further includes a dielectric two layer comprising said first high-k dielectric material.

5. The method of claim 1, further comprising forming a gate stack in a first FET region of said substrate, wherein said gate stack includes a gate comprising a portion of said metal one layer.

6. The method of claim 5, further comprising forming a gate stack in a second FET region of said substrate, wherein said gate stack in said second FET region of said substrate has an opposite conductivity type as said gate stack in said first FET region of said substrate.

7. The method of claim 1, where said metal one layer comprises a metal selected from the group consisting of tantalum (Ta), tantalum nitride (TaN), and titanium nitride (TiN).

8. A method of fabricating a flash memory cell in a semiconductor die, said method comprising: forming a control gate stack overlying a floating gate stack, said floating gate stack including a floating gate overlying a portion of a dielectric layer, said floating gate comprising a portion of a metal layer, and said dielectric layer comprising a first high-k dielectric material, wherein said control gate stack includes a control gate comprising a portion of another metal layer, and said control gate further comprises a portion of a polysilicon layer overlying said portion of said another metal layer.

9. The method of claim 8, wherein said control gate stack further includes another dielectric layer comprising a second high-k dielectric material.

10. The method of claim 8, wherein said control gate stack further includes another dielectric layer comprising said first high-k dielectric material.

11. The method of claim 8 further comprising forming a gate stack in a first FET region, wherein said gate stack in said first FET region includes a gate comprising a portion of said metal layer.

12. The method of claim 11 further comprising forming a gate stack in a second FET region, wherein said gate stack in said second FET region of said substrate has an opposite conductivity type relative to said gate stack in said first FET region.

13. The method of claim 8, wherein said metal layer comprises a metal selected from the group consisting of tantalum (Ta); tantalum nitride (TaN), and titanium nitride (TiN).

14. A method of fabricating a flash memory cell in a semiconductor die, said method comprising:

forming a control gate stack overlying a floating gate stack in a memory region of a substrate, said floating gate stack including a floating gate overlying a portion of a dielectric one layer, said floating gate comprising a portion of a metal one layer, and said dielectric one layer comprising a first high-k dielectric material, wherein said floating gate further comprises a portion of a polysilicon layer overlying said portion of said metal one layer.

15. A method of fabricating a flash memory cell in a semiconductor die, said method comprising: forming a control gate stack overlying a floating gate stack, said floating gate stack including a floating gate overlying a portion of a dielectric layer, said floating gate comprising a portion of a metal layer, and said dielectric layer comprising a first high-k dielectric material, wherein said floating gate further comprises a portion of a polysilicon layer overlying said portion of said metal layer.

16. The method of claim 1, wherein said portion of said polysilicon layer is in direct contact with said portion of said metal two layer.

17. The method of claim 8, wherein said portion of said polysilicon layer is in direct contact with said portion of said another metal layer.

* * * * *